United States Patent Office 3,582,458 Patented June 1, 1971

3,582,458

POLYIMIDE COMPOSITIONS AND METALLIC ARTICLES COATED THEREWITH

James R. Haller, St. Paul, Minn., assignor to Minnesota Mining and Manufacturing Company, St. Paul, Minn.

No Drawing. Continuation-in-part of application Ser. No. 648,945, June 26, 1967. This application Nov. 12, 1968, Ser. No. 775,204
Int. Cl. B32b *15/20, 27/34;* B44d *1/18*
U.S. Cl. 161—197 17 Claims

ABSTRACT OF THE DISCLOSURE

Polymer-metal laminate composites having improved adhesion between metallic and polymer laminae, the polymer consisting essentially of a mixture of a polyimide and a polyimide containing amide groups along the backbone of the polymer chain; and compositions adapted to making such laminates, containing the said polymer mixture in solution in a suitable solvent.

FIELD OF THE INVENTION

This application is a continuation-in-part of copending application Ser. No. 648,945, filed June 26, 1967, now abandoned.

This invention relates to polymer-metal composites, and more particularly to thin sheets of metal laminated with or coated with polyimide polymers, said polymers, containing in admixture therewith amide-modified polyimide polymers.

BACKGROUND OF THE INVENTION

Coating or lamination of polymers with metal is well known and is a common form of utilization of polymers having good dielectric properties, e.g. for insulation of electrical conductors, resistors and the like. A special use for metal-polymer composites is in the field of electrical circuit boards, wherein a thin copper sheet is laminated with a dielectric sheet and the composite is used to make electrical circuits, as by the well-known process of etching away unwanted portions, leaving conductor portions in a predetermined pattern upon the surface of the composite.

Coating of polyimides upon copper for insulating purposes has been disclosed in U.S. Pats. Nos. 3,179,614; 3,179,634; 3,190,856 and others. While for the purposes disclosed in those patents, the simple coating or laminating of polyimide and electrical conductive sheets was satisfactory, simple laminates of e.g. copper and polyimide have certain disadvantages which render them less suitable for electrical circuit boards or other critical uses than is desired.

One problem with these combinations is the low adherence of the polymer to the metal, thus permitting the insulating sheets to be easily stripped from the metallic conductors. Another difficulty is movement of the conductor on the sheet during or after etching, which alters the geometry of the components of the etched circuit board relative to the template from which it was produced and hinders alignment of the components of several circuit boards as in superimposed constructions.

The compositions used for coating metal sheets with polyimide films have heretofore been solutions of polyamic acids in suitable solvents therefor, e.g. as disclosed in U.S. Pat. 3,179,634. These solutions are coated on the said sheets, the solvent removed and curing effected by e.g. heating.

SUMMARY OF THE INVENTION

The present invention obviates the disadvantages of the prior art by providing a composition containing in admixture polyamic acids and amide-modified polyamic acids, in solution in conventional solvents. These compositions, after coating on the sheet and removal of solvent and curing, produce composite laminates in which the polymer film is very tightly adherent to the metal, markedly more so than the film if either polyamic acid or amide-modified polyamic acid alone is used as the film-former. The coating compositions can conveniently be termed "varnishes" and are sometimes so described herein.

In one aspect, this invention contemplates a composition for use as a varnish or enamel for producing advantageous dielectric films or coatings, whereby the adherence of polyimide films to metals is markedly improved. In another aspect, the invention contemplates provision of metal sheets, wires or electrical circuit board with improved properties. In another aspect, the invention is embodied in certain highly flexible modified polyimide-metal laminates in which the adherence of the polymer layer to the metal is far greater than that heretofore available. Other objects of the invention will be apparent from the disclosures hereinafter made.

Amide-modified polyamic acids and polyimides of the type which are employed in the compositions of this invention are described in U.S. Letters Pat. 3,320,202. These polymers when cured are characterized as linear polymeric amide-modified polyimides. They have amide links in the backbone of the polymer and are conveniently prepared as disclosed in the said patent, by the reaction of an aromatic carboxylic anhydride-acid, e.g. trimellitic anhydride, and aromatic diamines. In their preparation they form an intermediate polyamide-acid or a partially imidized polyamide-acid or iminolactone polymer stage, which intermediates are soluble in certain solvents such as dimethyl formamide, dimethyl acetamide and the like. The intermediate stage polymer is curable to the polyamide-imide form by heat or chemical dehydration.

Even when partially cured, or imidized, the amide-acid stage polymer of the amide-modified polymers retains solubility in useful solvents, and partially imidized polymers of this type can be used in the coating compositions in this invention. While in some cases commercially available solutions of amide-acid polymers of this type may contain few or none of the ultimate imide groups, it is believed that commonly at least about 15 percent of the nitrogen atoms present are in the form of imide groups; imide group contents of as much as 35 percent or somewhat more in the polymers yield useful results as primers for the invention.

The polyimides used in the invention are those of the type described in U.S. Pats. Nos. 3,179,634 and 3,179,633. These polymers have an intermediate polyamide-acid stage in which they are soluble in certain solvents, and these solutions are conveniently employed for making coatings or for other purposes of fabrication. Polyamide-acids of the type which are employed herein, and which are intermediates in the preparation of the said polyimides, are more fully described in U.S. Pat. 3,179,614. These polyamide-acids are likewise conveniently cured by heating, although chemical curing methods are also known.

The compositions of the invention are essentially a mixture of the selected polyamic acid with an amount effective to promote adhesion up to about 90 percent by weight of an amide-modified polyamic acid as described above, in solution in a solvent which is volatile, enough to permit "drying" of the mixture by evaporation of solvent. To this solution may be added adjuvants such as pigments, surfactants and the like. The preferred mixtures contain from 10 to 85 percent amide-modified polyamic acid; but even amounts of added amide-modified polyamic acid less than 5 percent bring about noticeable improvement in adhesion of the polyimide to the metal.

Broadly speaking, in producing the polymer-metal laminate composites of the invention, a metallic surface, for example a copper wire or copper sheet which may be of the order of 0.5 to 10 mils or greater in thickness, is first cleaned to remove greasy films from the surface. The surface may then be roughened, if desired, as by etching with a chemical etching solution, the solution and any etching residue removed, and the sheet dried. The prepared metal sheet is then coated with the varnish composition of the invention, as by brushing, spraying or knife coating. Desirably a substantially uniform coating is applied over the entire surface, usually to a wet film thickness which, when dried and cured, leaves a surface film of e.g. 0.15 to 5 mils in thickness. Various factors influence the wet thickness of the film, such as solids concentration in the solution, viscosity of the polymer, etc. Variations are readily determined and compensated for by empirical methods.

The wet film thickness of the coating is regulated by the final thickness of polyimide layer which is desired. The solvent is removed from the wet film by evaporation, e.g. under reduced pressure, and the film becomes tack-free when it still contains about 40 to 60 percent by weight of solvent. At this point the film can be cured by heating, during which the remainder of the solvent evaporates.

The intermediate stage polymer coatings are preferably cured by heating, whereupon they are converted to modified polyimide polymer, or dielectric layer, of the resulting composite. For the purposes of the invention, it is desirable that the final polyimide layer at least be self-supporting, e.g. if the metal is to be removed as by etching. A dry, cured thickness of about 0.15 to upwards of 5.0 mils is preferred.

The composite formed according to the invention are very flexible and strong, and the polymer is tightly adherent to the metal. When the unwanted metal is removed as by etching, the films which remain are flexible and strong, and the remaining metal is still tightly adhered. Shrinkage on etching is relatively small.

Dimensional stability may be enhanced further by impregnating a heat-resistant fibrous or web-like porous backing. For example, glass cloth may be dipped into the varnish composition. When the glass cloth is thoroughly wetted, it is applied to the metal surface and then dried and cured. The varnish may be applied by other suitable methods such as brushing or knife coating. The result is a flexible and strong laminate having all the desirable properties of the above-described composite but, in addition, having less shrinkage and expansion when the metal is removed or etched than the polymer alone, thereby reducing "curling" and making the product more workable. The heat-resistant, fibrous, woven or non-woven porous backing may be any material capable of withstanding temperatures up to 500° F. for at least 30 seconds without noticeable degradation or deformation. The maximum thickness of the material is 10 mils, the preferred range being from about 1 to 4 mils.

Instead of forming a polyimide dielectric layer upon only one side of the metallic substrate to form the composite, the polyimide layer can be placed on both sides of the metallic sheet, e.g. after etching to form a printed circuit.

Compared with either simple polyimide films or amide-modified polyimide films formed directly upon the surface of cleaned copper, coatings prepared using the technique of the present invention are found to be from 2 to more than 10 times more tightly adherent to the metallic surface. Attempted separation of the layers, as by peeling, generally causes at least partial disruption of the polymeric layer. In some cases there is failure or disruption of the metallic substrate, e.g. where soft metals such as copper are used.

Any metallic surface can be coated with the compositions of the invention to secure the advantageous results. Metallic sheets or foils which have been found to be particularly useful for the purposes of the invention, e.g. for production of electrical circuit boards, cables and similar devices, are copper, silver and nickel-chromium alloy such as Nichrome. (Nichrome is the trade name for a high melting point alloy of 60 percent nickel, 25 percent iron and 15 percent chromium; or 80 percent nickel and 20 percent chromium, used in electrical resistance devices.) However, other metals such as iron, aluminum and the like, can also be usefully coated with these compositions.

The peel strength of laminates produced in the invention can be measured by the following method which is a modification of ASTM D-1867: Components for making printed circuit elements are provided with a resist printed in the usual way (e.g. by silk-screen methods) and then etched so that copper strips 1/32" wide remain. After removal of the resist material, the composite is mounted in an Instron testing machine in such a way that the copper strip is peeled back from the polyimide film at an angle of 180°, the jaw separation rate being 2 inches/minute. Results are measured in lbs./inch, the actual values obtained being, in this case, multiplied by 32. Tests on various materials show that peel strength up to 13 lbs./inch can be measured in this way; above 13 lbs./inch the copper fails.

While the laminates of the invention have been described with respect to uses as flexible circuit boards, they are not so limited, since the process can be employed to produce a strongly adherent, abrasion-resistant insulating coating for e.g. copper wires, ribbon and the like, as well as heat-resistant coatings for resistors or heating elements, such as heating panels and the like.

The following examples, in which all parts are by weight unless otherwise specified, will more particularly illustrate the invention and the novel embodiments thereof. These examples are not to be construed as limiting the scope of the invention in any way.

EXAMPLE 1

Commercial copper foil produced by the electrolytic process was coated as follows:

A polyamide-imide polymer, the monomeric components of which were trimellitic anhydride and methylene dianiline (p,p'-diaminodiphenylmethane), was dissolved in dimethyl acetamide to 15 percent solids by weight. The solution had bulk viscosity of about 50 cp. at 23°/C. The polymer is available commercially under the trademark "Amoco" AI-Type 10.

A polyamide-acid solution was prepared from a mixture of equimolar amounts of pyromellitic dianhydride and 4,4'-diaminodiphenyl ether, in dimethyl acetamide. Polymerization was continued until the inherent viscosity of the polymer was 1.64, concentration of 0.5 g. per 100 ml., solvent dimethyl acetamide, at 25° C. To facilitate spreading, 0.25 percent of a flow control agent consisting of a silicone fluid (available commercially under the trademark "Union Carbide L-520") was added to this solution. The final solids content of this solution was 15 percent.

For preparing exemplary compositions and laminates of the invention, amounts of the polyamic acid solution and amide-modified polyamic acid solution were mixed to give mixtures in which the amounts of amide-modified polyamic acid were varied to be from 20 to 95 percent by weight of the solids present. These and samples of unmixed solutions were applied to the rough side ("Treatment A," i.e. black, oxidized surface) of the copper foil using a knife applicator, the wet film coating thus produced being 12 mils in thickness. The thus-coated foil samples were placed in a forced-air oven and heated to 315° C., remaining at 315° C. for 15 minutes, thus curing the polymers to the polyimide form.

After removing from the oven, it was found that the cured composites had a clear, hard and tough film about 1 mil in thickness adhered to the copper surface. (The uncoated surface of the copper was dark owing to oxidation during curing. This dark residue could be removed from the surface e.g. by dipping the composite for about 15 seconds into a commercial ammonium persulfate etching solution.)

After cleaning, the copper composite is washed with water, and dried. The composite can be further treated to keep the exposed copper surface bright and clean during storage, if desired. Commonly used agents for this purpose include sodium pyrophosphate and light oil, inhibitors, etc. in suitable aqueous or non-aqueous solvents.

Each of the composites thus prepared was tested to determine the peel strength. The results were as follows:

TABLE I

| Percent amide-modified polyamic acid in varnish: | Peel strength, lbs./inch width |
|---|---|
| 0 | 0.31 |
| 20 | 1.90 |
| 40 | 1.93 |
| 50 | 2.55 |
| 60 | 3.15 |
| 70 | 3.32 |
| 80 | 2.71 |
| 85 | 2.39 |
| 90 | 0.66 |
| 95 | 0.39 |
| 100 | 0.75 |

Another test run made with amounts of additive amide-modified polyamic acid including amounts lower than 20 percent showed marked improvement in adherence at as low as 5 percent, the plot of the values obtained indicating that adhesion at 5 percent is about double the value for adhesion when no polyamide-modified polyamic acid is used.

Substantially higher adherence values have been observed than those set out in Table I, depending to some extent on the pretreatment of the copper surface. Thus, values of over 3 lbs./inch with 10 percent of additive up to 10 lbs./inch with 65 percent additive have been noted; in each case the effect increases rapidly as incremental additive amounts increase to 10 percent.

Strong, flexible self-supporting clear amber-colored films about 1 mil in thickness remained when the copper foil was etched away from composites made with 10 percent amide-modified polyimide films, using aqueous ferric chloride. Standard test methods showed they have excellent electrical properties, with dielectric constant K of the order of 3.53–3.57 at −40° C. to 250° C. at 100 cycles and 3.47–3.51 at 100 kilocycles; and dissipation factor $D_x$ of the order of $0.20–0.55\times10^{-2}$ at 100 cycles and $0.22–0.44\times10^{-2}$ at 100 kilocycles.

EXAMPLE 2

Other types of amide-imide polymers can be used in the compositions of the invention. A copper sheet, as in Example 1, is coated with a composition in which the amide-modified polyamic acid solution used is a 16.5 percent solids solution in dimethyl acetamide of an amide-imide copolymer from pyromellitic dianhydride and 3,4′-diaminobenzanilide. Equal amounts of this solution and the polyamic acid solution of Example 1 are thoroughly mixed and a wet coating about 10 mils in thickness knife coated onto the copper. The composite is dried, cured and cleaned as in Example 1. The polyimide layer of the composite is strongly adherent to the copper.

EXAMPLE 3

Nichrome wires or sheets can be coated as follows. A sheet of smooth Nichrome (80 percent nickel-20 percent chromium alloy) 1.0 mil in thickness is cleaned by dipping the foil into a 45 percent aqueous ferric chloride solution for 20 seconds, followed by an immediate water wash and hot air drying. A mixture of equal parts of a solution in dimethyl acetamide of an amide-modified polyimide formed from trimellitic anhydride and methylene dianiline, the solids content of the solution being 15 percent, and the dimethyl acetamide solution of polyamide-acid prepared from a mixture of pyromellitic dianhydride and 4,4′-diaminodiphenyl ether, as used in Example 1, is then knife coated over the nickel-chromium alloy surface, the wet film thickness being 7 mils. The composite is then cured as set forth in Example 1. It is not necessary to clean the cured composite. The thickness of the polyimide film of the cured composite is about 0.5 mil.

The resulting polyimide film is strongly adherent to the nickel-chromium alloy sheet. Silver wire or sheets can be coated in the same way.

EXAMPLE 4

Composite copper foil-polyimide dielectric laminates in which the polyimide film contains about 65 percent of amide-modified polyimide were prepared as set forth in Example 1. Several sheets of such composites were laminated in superimposed relationship as follows: (Lamination can be carried out on the sheets as produced, or after an electrical circuit in desired form is produced by the known process of coating the copper surface with a photosensitive resist, exposing the resist to actinic light through a photographic negative provided with the pattern to be reproduced, removing portions of the resist not affected by light, etching the copper away from the dielectric film in the thus exposed areas and removing the remainder of the resist material. The polyimide films are self-supporting, strong and flexible where the copper is removed.)

The dielectric film side of at least one of the sheets is knife-coated with a thin coating of a pressure-sensitive adhesive in a 40 percent solids solution. The adhesive used is described in U.S. Letters Pat. 3,307,690. The solvent is removed from the adhesive layer on the film by heating at about 80° C. for about 5 minutes. The film sides of two sheets, on of which is coated with the adhesive, are then brought together between two nip rolls. One roll, made of metal, is heated to a surface temperature of about 150° C.; the other roll, of silicone rubber, is unheated. The rolls are pressed together with moderate pressure, and the speed of lamination is about 6 inches per minute.

The resulting sandwich construction was strong and free from blisters. The laminate was separated at the adhesive bond only with great difficulty.

EXAMPLE 5

Long strips of a composite of one ounce electrolytic copper foil and polyimide dielectric in which the polyimide lamina contains about 65 percent of amide-modified polyimide were produced as described in Example 1. This composite was formed into a strip cable containing several wires as follows:

Three strips of ½″ wide pressure-sensitive plastic tape (e.g. of the type used for electrical insulation purposes) were applied to the cleaned copper side of the composite so that the strips were parallel to and ⅛ inch away from the edge of the composite, and about ⅛ inch apart. In this way, three ½ inch wide conductors are formed on a two inch wide strip of composite. The assembly was placed in an aerated etching solution having the following composition:

$(NH_4)_2S_2O_8$—2 kg.
$H_2O$—8 liters
Conc. $H_2SO_4$—100 ml.
10% aqueous $HgCl_2$ solution—20 drops After 30 minutes in the etching bath, the copper where not protected by the plastic tape was completely etched away. The plastic tape was then removed, and the composite having copper strips on a self-supporting polyimide film was replaced in the aerated etching solution for three minutes, then washed with tap water and dried. The surface of the remaining strips was roughened by etching in this way and was similar in appearance to the rough surface of electrolytic copper foil. After drying, the remaining copper strips and composite surface were coated with the mixture of amide-modified polyamide-acid and polyamide-acid solution in the same way as in the production of the original composite, so as to form a continuous dielectric coating in which the copper strips are embedded. The coating was dried and cured according to the time and temperature schedule set forth in Example 1.

The strip of cable thus produced was examined under a microscope and found to be free from delamination or blisters. The second coating of polyimide was found to be strongly adherent both to the initial polyimide dielectric layer and to the copper strips. The composite thus produced was very flexible and strong, and there was a continuous insulating coating over the conductors.

Other dielectric materials can be employed to coat the conductors which are formed in making cables as set forth above. Thus, for example, after copper conductor strips have been formed, as set forth above, a sheet or strip of irradiated polyethylene cut to fit over the entire area of the modified polyimide dielectric film is laminated to the composite. Irradiated polyethylene consisting of 100 parts of low density polyethylene (available under the trademark designation "DYNH"), 10 parts of synthetic rubber ("GRS–1011"), 0.15 part of an anti-oxidant (e.g. "Akroflex C") and 2 parts of carbon black ("Carboloc No. 2"), irradiated to a sol fraction of 0.34, film thickness 7 mils, was used. The polyethylene was disposed over the surface of the composite so as to contact the copper and film surfaces. A Carver press was employed to press the polyethylene and the composite having the copper conductors together, for about 5 minutes at a temperature of about 150° C. and at a pressure of about 1500 p.s.i.g. The press was cooled and the laminate removed. The polyethylene was firmly bonded to the composite without air entrapment, and the polyethylene portion of the laminate could be peeled away only with difficulty.

In the same way, a film of the thermoplastic copolymer of polytetrafluoroethylene and hexafluoropropylene ("Teflon FEP") was used in place of the polyethylene. The film was 2 mils in thickness, and the assembly was pressed at about 310° C. for five minutes at 30 p.s.i.g. After cooling, the laminate was removed and it was found that the polymer film was tightly adhered to both the copper and the exposed portion of the modified polyimide dielectric substrate.

When desired, pigments or other additives can be incorporated in the solutions of primer or polyamic acid intermediate stage resin, e.g. to impart color for coding purposes or to alter the dielectric or other properties of the modified polyimide film layers.

EXAMPLE 6

When a solution of the copolymer of bis(4-aminophenyl)ether and 3,4,3′,4′-benzophenone tetracarboxylic dianhydride is used in the procedure of Example 1 instead of the copolymer of bis(4-aminophenyl)ether and pyromellitic dianhydride, similar results are obtained, thus showing that the polyamide-modified polyamic acid polymer improves the adhesion to metal of polyimides generally.

EXAMPLE 7

A polyamide-imide polymer and a polyamide-acid solution is dissolved in dimethyl acetamide in a 55:45 ratio as described in Example 1. A Style 108 starched 2 mil glass cloth is dipped in the solution and then brought in contact with a one ounce (1.4 mil) Treatment A Electrolytic-Copper Foil (Circuit Foil Corp.). This wet laminate is placed in a three zone vertical oven to dry with the zone temperatures set at 210°, 260° and 270° F. The speed is one-half yard per minute, which allows about six minutes exposure of the laminate in each zone. The material is given a second pass for curing at one-half yard per minute through the ovens, which are now set at 330°, 380° and 600° F. The copper oxide which is formed on the surface is removed by treating with an ammonium persulfate solution and washing. The product was found to have less expansion or shrinkage than the polymer backing by itself. The copper laminate lay relatively flat with only a slight curl toward the copper and was strong and flexible. A laminate not containing the glass cloth but made using the same coating resin and conditions exhibited cupping and curling away from the copper.

EXAMPLE 8

The procedure and formulations are the same as in Example 7. However, cloth made of polymetaphenylene diamine isophthalamide (which is available under the trade name "Nomex") is used to form the backing in place of glass cloth. The results obtained were similar to those obtained in Example 7 in that a non-curling laminate was obtained.

EXAMPLE 9

The procedure and formulations are the same as in Example 7. However, Nomex (polymetaphenylene diamine isophthalamide) paper is used to form the backing in place of glass cloth. The laminate obtained was similar to that obtained using glass cloth in Example 7.

What is claimed is:

1. A metal polyimide composite, comprising layers of metal and a polymer substrate, said substrate comprising an unmodified polyimide polymer containing in admixture an amount effective to promote adhesion up to about 90% by weight of amide-modified polyimide, formed by the reaction of an aromatic diamine and tri-mellitic anhydride, the polymeric portion of said composite forming a strong, flexible adherent dielectric film which is self-supporting when said metal is removed by chemical means.

2. A composite according to claim 1, in which the amount of amide-modified polyimide is about 10 to 85 percent by weight.

3. A composite according to claim 1, in which the metal is copper, silver or nickel-chromium alloy.

4. A composite according to claim 2, in which the metal is copper.

5. A composite according to claim 1, in which the polyimide is poly bis(4-aminophenyl)ether pyromellitimide.

6. A composite according to claim 5, in which the amide-modified polyimide is a copolymer of trimellitic anhydride and methylene dianiline.

7. A composite according to claim 5, in which the metal is copper.

8. A composite according to claim 5, in which the metal is a nickel-chromium alloy.

9. A dielectric-conductive metal composite sheet adapted for etching to form at least one electrical circuit element thereon, comprising a thin electrically-conductive metallic sheet, and a polymer substrate coating thereover, said substrate comprising an unmodified polyimide containing an amount effective to promote adhesion up to about 90 percent of amide-modified polyimide, formed by the reaction of an aromatic diamine and tri-mellitic anhydride, forming a dielectric layer on said sheet, said dielectric layer supporting said composite and being strongly adherent to the remaining metal after portions of said metallic sheet are removed as by etching.

10. A composite sheet according to claim 9, wherein the conductive metallic substrate is copper and the polyimide is poly bis(4-aminophenyl)ether pyromellitimide.

11. A composite sheet according to claim 10, wherein the amide-modified polyimide is a copolymer of trimellitic anhydride and methylene dianiline.

12. A laminated metal-polyimide composite according to claim 1, comprising superimposed and adhered layers of dielectric-conductive metal composite sheets, the metallic portions thereof forming electrical circuit elements and the dielectric portions thereof being comprised of combined amide-modified polyimide, formed by the reaction of an aromatic diamine and tri-mellitic anhydride, and polyimide as a coating thereover.

13. A laminated metal-polyimide composite according to claim 12, wherein the polyimide is poly bis(4-aminophenyl)ether pyromellitimide.

14. A unitary metal-polyimide composite according to claim 1 having a heat-resistant porous web-like backing carried by and at least partially embedded in said polymeric layer; said backing providing improved dimensional stability.

15. The unitary metal-polyimide composite of claim 14, wherein said heat-resistant porous web-like backing is completely embedded in said polymeric layer.

16. The unitary metal-polyimide composite of claim 14, wherein said heat-resistant porous web-like backing comprises glass cloth.

17. The unitary metal-polyimide composite of claim 14, wherein said heat-resistant porous web-like backing comprises polymetaphenylene diamine isophthalamide cloth.

References Cited

UNITED STATES PATENTS

| | | | |
|---|---|---|---|
| 3,454,445 | 7/1969 | Durst et al. | 156—306 |
| 3,486,934 | 12/1969 | Bond et al. | 117—218 |
| 3,179,634 | 4/1965 | Edwards | 161—227 |
| 3,320,202 | 5/1967 | Bolton | 260—302 |
| 3,342,897 | 9/1967 | Abramo | 260—857 |
| 3,424,718 | 1/1969 | Angelo | 260—47 |
| 3,442,703 | 5/1969 | Naselow | 117—232XR |
| 3,179,635 | 4/1965 | Frost et al. | 260—78 |

FOREIGN PATENTS

| | | | |
|---|---|---|---|
| 729,275 | 3/1966 | Canada | 260—78 |

JOHN T. GOOLKASIAN, Primary Examiner

L. T. KENDELL, Assistant Examiner

U.S. Cl. X.R.

117—230; 161—213, 214, 227; 260—47, 78, 857